(12) United States Patent
Sharaf

(10) Patent No.: US 11,929,707 B2
(45) Date of Patent: Mar. 12, 2024

(54) SYSTEM FOR MAXIMIZING SOLAR INSOLATION UTILIZATION IN POWER GENERATION

(71) Applicant: Nasir Sharaf, Bloomfield Hills, MI (US)

(72) Inventor: Nasir Sharaf, Bloomfield Hills, MI (US)

( * ) Notice: Subject to any disclaimer, the term of this patent is extended or adjusted under 35 U.S.C. 154(b) by 62 days.

(21) Appl. No.: 16/948,777

(22) Filed: Sep. 30, 2020

(65) Prior Publication Data
US 2022/0103119 A1    Mar. 31, 2022

Related U.S. Application Data

(60) Provisional application No. 62/914,528, filed on Oct. 13, 2019.

(51) Int. Cl.
| | |
|---|---|
| *H02S 40/22* | (2014.01) |
| *F21V 8/00* | (2006.01) |
| *G02B 19/00* | (2006.01) |
| *H02S 20/32* | (2014.01) |

(52) U.S. Cl.
CPC .............. *H02S 40/22* (2014.12); *G02B 6/001* (2013.01); *G02B 6/003* (2013.01); *G02B 6/0063* (2013.01); *G02B 19/0009* (2013.01); *G02B 19/0042* (2013.01); *H02S 20/32* (2014.12)

(58) Field of Classification Search
CPC ....... H01L 31/00–078; Y02E 10/50–60; H02S 20/00–32; H02S 30/00–20; H02S 40/00–22
See application file for complete search history.

(56) References Cited

U.S. PATENT DOCUMENTS

| | | | | |
|---|---|---|---|---|
| 2002/0148497 | A1* | 10/2002 | Sasaoka | G02B 6/4298 136/243 |
| 2007/0084503 | A1* | 4/2007 | Huang | H01L 31/0547 136/246 |
| 2019/0131921 | A1* | 5/2019 | Bae | G02B 6/001 |
| 2020/0006586 | A1* | 1/2020 | Bae | G02B 6/0006 |
| 2021/0013346 | A1* | 1/2021 | Pierce | H01L 31/047 |

FOREIGN PATENT DOCUMENTS

| | | | |
|---|---|---|---|
| CN | 201867653 | * | 6/2011 |
| KR | 20160071486 | * | 6/2016 |
| WO | WO-2015173924 A1 | * | 11/2015 ............. H02S 40/22 |

OTHER PUBLICATIONS

KR20160071486 English (Year: 2016).*
WO2015173924 English translation (Year: 2015).*

* cited by examiner

*Primary Examiner* — Bach T Dinh
(74) *Attorney, Agent, or Firm* — The Dobrusin Law Firm, P.C.; Daniela M. Thompson-Walters

(57) ABSTRACT

A variety of solar panels, light guides (or similar mediums) and light concentrators are configured to increase the power generated by the solar panels. In general embodiments of this system include at least one light guide between at least two solar panels with some light concentrator concentrating the light into the light guide held in some housing.

13 Claims, 4 Drawing Sheets

SYSTEM FOR MAXIMIZING SOLAR INSOLATION UTILIZATION IN POWER GENERATION

FIELD OF INVENTION

The present invention relates to a device to redirect concentrated sunlight to maximize the number of panels that can be used for a given surface area, more specifically, a device that will organize solar panels, a light concentrating medium, and a light dispersing medium to increase the power generated in a given area and was invention described in provisional patent application No. 62/914,528.

BACKGROUND OF THE INVENTION

Solar panels are comprised of many smaller solar cells in a solar cell array that uses the photoelectric effect to convert sunlight into direct current (DC) electricity. In both off-site and on-site generation in a solar power plant, these solar panels must be equipped with an inverter to convert the DC electricity to alternating current (AC) electricity. These solar panels are used in industrial, commercial, and residential applications to generate on-site electricity either for redistribution or for immediate consumption. These solar panels are either roof mounted or mounted in a field in what is commonly referred to as a solar power plant.

Roof mounted solar panels are commonly seen for commercial and residential applications for immediate consumption. Roof mounted solar requires 1) costly labor to securely and professionally mount onto an existing roof and 2) a large surface area of the building that only the roof can provide. Often, a facility will not have the necessary surface area, or are unwilling to use all of the surface area allotted, to power the whole facility so solar panel applications are not feasible.

Field mounted solar panels are common to utilities, industrial, and some commercial applications. These consumers generally have large real estate for solar panel operations, so surface area scarcity is not an issue. Instead, these users are often selling solar generated power to meet the demands of customers in a sustainable or economically feasible way. Increasing the solar production capabilities of these solar panel users would enable further market penetration, increased power generation, and potentially increased profits.

In both of these instances mentioned above the panels are fixed, meaning they do not track the sun. For this reason, these devices cannot take full advantage of the available solar energy. An actively tracking solar panel results in significantly more electric power generation.

This disclosed innovation aims to address both by offering a device to increase solar power production per unit area. Also, solar tracking will be much more feasible and economical with the proposed invention. This innovation will thus increase total power production for existing utility, industrial, and commercial scale solar power plants. This will also enable private commercial and residential areas to consider solar panel solutions if they may have previously lacked real estate. There may be other applications, including but not limited to enabling solar transportation such as solar electric vehicles and solar electric planes, compact or "drop-in" microgrid solutions, and high orbit satellites.

There have been inspirations in the design of this system that have similar elements but do not provide the same value that this invention offers. Researchers at the Massachusetts Institute of Technology (MIT) previously developed fiber optic cable clad in solar cells. This differs significantly because it cannot accommodate existing solar panels and is a separately manufactured item. MIT also created a stand that housed several panels but this stand did not use a light concentrator or light diffuser in any way. Finally, active solar daylighting systems use solar concentrators and solar diffusers, but do so to provide indoor lighting, nor to generate power or illuminate solar panels in any way.

SUMMARY OF THE INVENTION

The present invention relates to an arrangement that uses a light concentrating medium to concentrate sunlight into a light transfer medium, which disperses the concentrated sunlight out of a light dispersing medium onto solar panels arranged to minimize the surface they occupy. The invention exploits the fact that light travels much faster than the rate at which electrons are ejected from individual atoms through photoelectric effect. The invention captures on coming light through some sort of a concentrator e.g. a circular or linear convex lens or a circular or linear Fresnel lens (if needed) and then redistributes the light using a medium in a direction perpendicular to the oncoming solar insolation. Photocells or panels are then disbursed along the length the light diffusing medium so that they photo cells face the light. As mentioned earlier, since the ejection of electrons is much slower than the light speed, solar insolation is practically always available for electricity generation. This idea enables to harvest light not only from the solar insolation area flux but also from the solar insolation volumetric flux, as much as allowed by the material limits related to light transferring and diffusing materials.

The invention also allows concentrators to collect the solar light in a remote location and guide the light through flexible light guides, distributing the light in a similar fashion as mentioned above.

1—In one embodiment, there are multiple Fresnel lenses (light concentrators) that concentrates the sunlight onto a light guide plane or light guide panel, on either side of which is a solar panel. This arrangement increases the depth the solar panels occupy but reduce the surface area needed to face the sun and double the panels. This arrangement, as with all other embodiments, could be equipped with a solar tracker to maximize sun exposure. This particular embodiment could be stacked such that the Fresnel lenses ultimately occupy the same (or greater) area as the singular solar panel might occupy, but now feeds a multitude of panels instead of just one.

2—Yet in another embodiment, a linear concentrating lens is used instead of a Fresnel lens. This reduces the tolerance stack up of how the light is cast into the light guide making for more smooth and consistent light dispersion out of the light guide.

3—In another embodiment, light pipes are used for light dispersion instead of a light guide. These light pipes are beneficial because they are stiffer than fiber optic cables and are easier to handle for manufacture.

4—In another embodiment, side-emitting fiber optic cables are used for light dispersion instead of a light guide. These have the potential of having more efficiency than light pipes.

5—In another embodiment, a convex lens concentrates the light along a conical prism directly into a light pipe or side emitting fiber optic cable. This is done to minimize a deviation of the focal point from the end of the light dispersing medium.

6—In another embodiment, a solar tracker or heliostat is connected to a motor actuator system to constantly reposition the system towards the light source. This will further maximize the amount of light captured by the solar stack system.

7—In another embodiment, a solar tracker or heliostat is connected to only the lenses, repositioning the lenses towards the light source. This may be useful for situations in which the system is moving, like electric transportation applications. In this scenario, the sunlight to be harvested may strike the roof of an electric car or electric train, but because the vehicle is constantly repositioning itself the lenses will have to readjust.

8—In yet another embodiment, multiple solar panels are positioned horizontally next to one another along the length of the light guide thus increasing depth and decreasing surface area needed for insolation.

9—In another embodiment, the concentrating array is isolated as a separate device from the solar panel stack. This concentrating array can consist of a concentrating medium, like the aforementioned Fresnel lens, linear concentrating lens, or simple convex lens, and this concentrating medium concentrates sunlight into fiber optic cables. These fiber optic cables travel a distance and connect to a light dispersing medium, like the aforementioned side-glow fiber optics or light guide. The light dispersing medium is in between solar panels and illuminates both solar panels. The benefit of this design is that the light can be collected in a separate location from where the energy is generated. This is ideal if the solar stack needs to be located indoors or next to some specific machinery that doesn't have clear line of sight to the sun.

It will be appreciated that alternate embodiments in keeping with the principles of the present invention might be utilized. It is to be understood, however, that even though numerous characteristics and advantages of the invention have been set forth in the foregoing description, together with the details of the structure and function of the invention, the disclosure is illustrative only, and changes may be made in detail, within the principles of the invention, to the full extent indicated by the broad general meaning of the terms in which the appended claims are expressed.

DETAILED DESCRIPTION OF THE EMBODIMENTS

Figure 1:
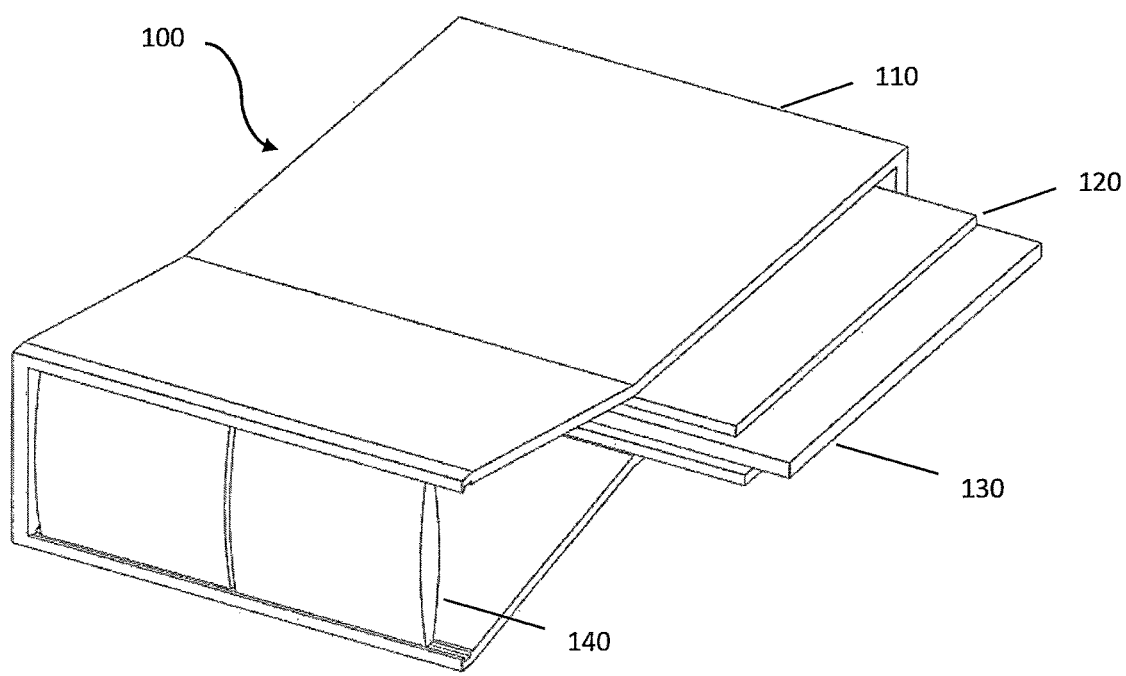
FIG. 1—A perspective drawing of one of the above detailed embodiments in which there is a concentrating lens that tapers into a light pipe between two solar panels in an enclosure.
Figure 2:
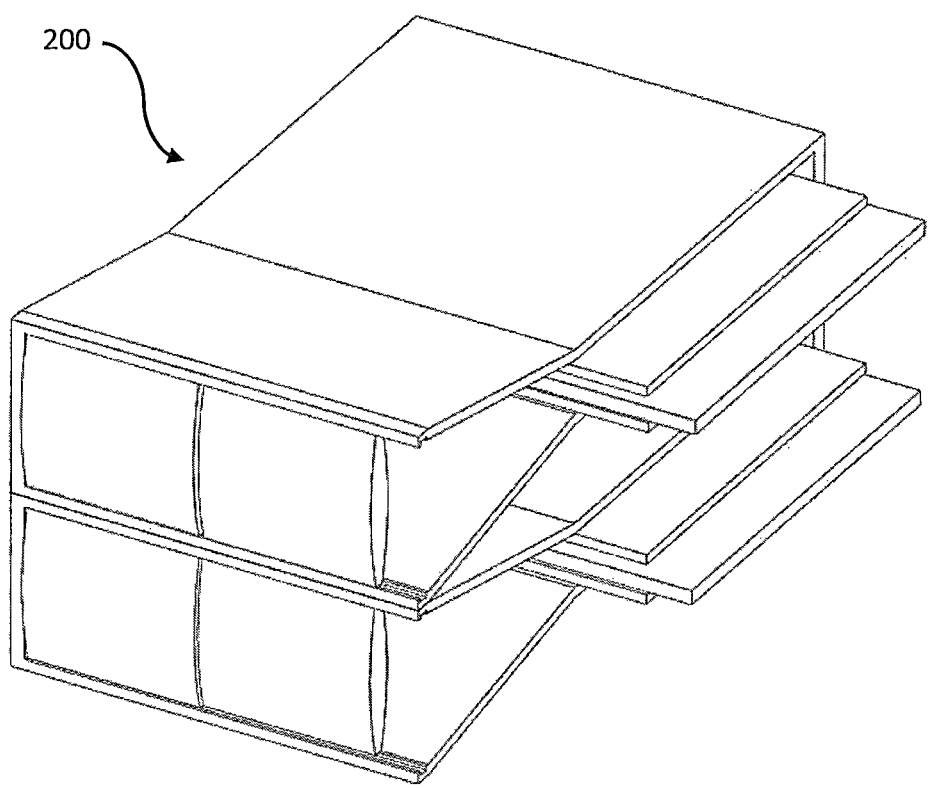
FIG. 2—A perspective drawing of one of the above detailed embodiments in which there are several concentrating lenses that tapers into a light pipe between two solar panels in an enclosure arranged so that they are stacked atop each other.
Figure 3:
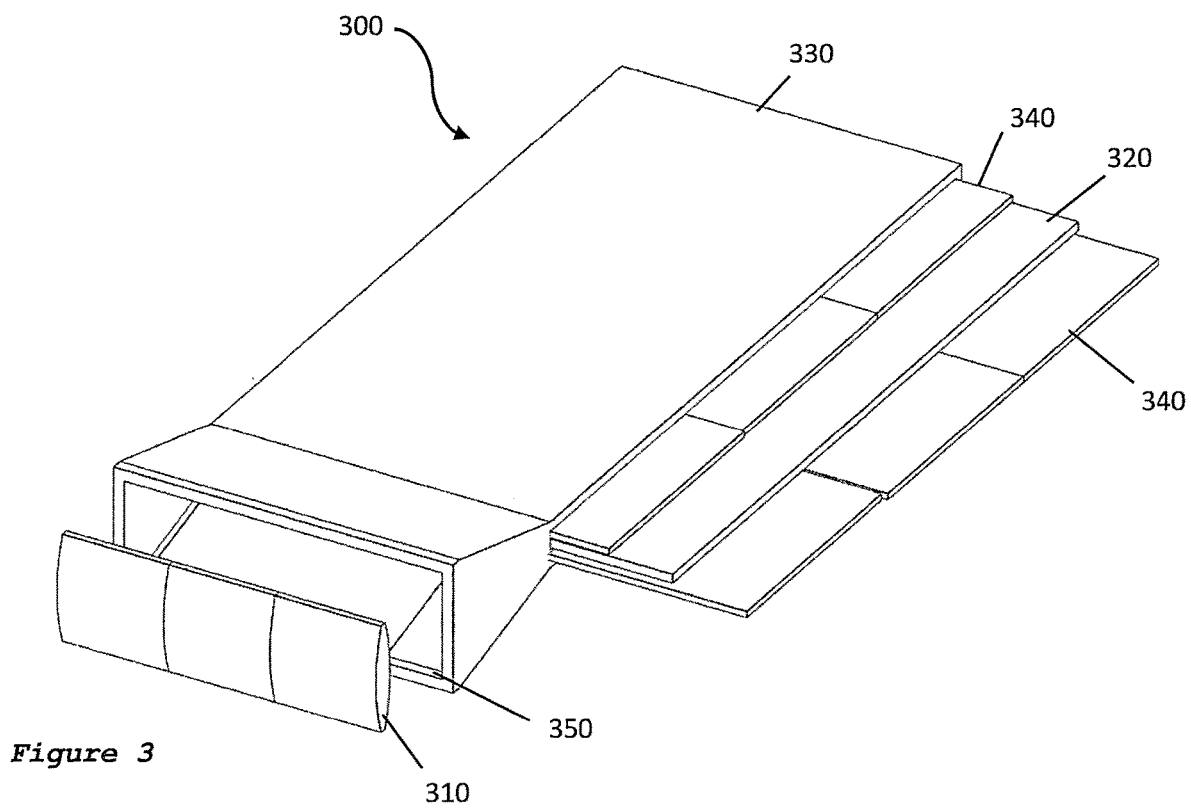
FIG. 3—A perspective drawing of one of the above detailed embodiments in which there is a linear concentrating lens that feeds the sunlight into a light guide panel on either side of which there are three solar panels.

Referring now to the drawings in detail, where in like numerals identify similar elements throughout, FIG. 1 shows an embodiment of the solar panel stack assembly system in accordance with the principles outlined in the summary section of this patent. FIG. 2 shows a variation of several of the embodiments in FIG. 1 stacked on top of each other. FIG. 3 shows a similar embodiment that uses variations of specific elements but also adheres to the principles of using solar panels, a light concentrating medium, a light dispersing medium, and a housing to support all sub elements.

In FIG. 1 the assembly 100 consists of a U-shaped housing 110 fitted with two grooves on each of the long arms of the housing for a total of four grooves. In these grooves, solar panels 120 are slid in and secured. On the face of the housing there are four through holes that are sized to fit in the light concentrating and light dispersing mediums 130. Here, the light concentrating and light dispersing mediums are one and the same. The light concentrating portion is a convex lens 140 that concentrates sunlight, like a magnifying lens. This is connected by a conical glass piece to the light dispersing light pipe 150. This light pipe is a long, thin piece of glass designed to maximize light dispersion out the length off the piece. The tail ends of the light pipes go in between the solar panels fitted in their slots. The conical glass connection serves to align the cast concentrated light directly into the light pipe.

FIG. 2 consists of several of the assemblies described in FIG. 1 stacked on top of each other. A similar stacked arrangement could also be done with FIG. 3 or the other embodiments described above.

In FIG. 3 the housing assembly 200 consists of a linear concentrating lens 210 as the light concentrating medium, an edge lit light guide 220 for the light dispersion medium, and a housing 230 that holds a total of six panels 240, the light guide 220, and the linear concentrating lenses 210. The front of the housing has a slot 250 that allows three linear concentrating lenses, in this embodiment. The face 250 of the housing tapers down to a linear hole, which is where the light will be cast. This hole is also where the edge lit light guide 220 will receive the concentrated light. This hole also leads to where the light guide 220 and the solar panels 240 will be housed. The solar panels 240 and light guides 220 can be slid in and out.

Figure 4:
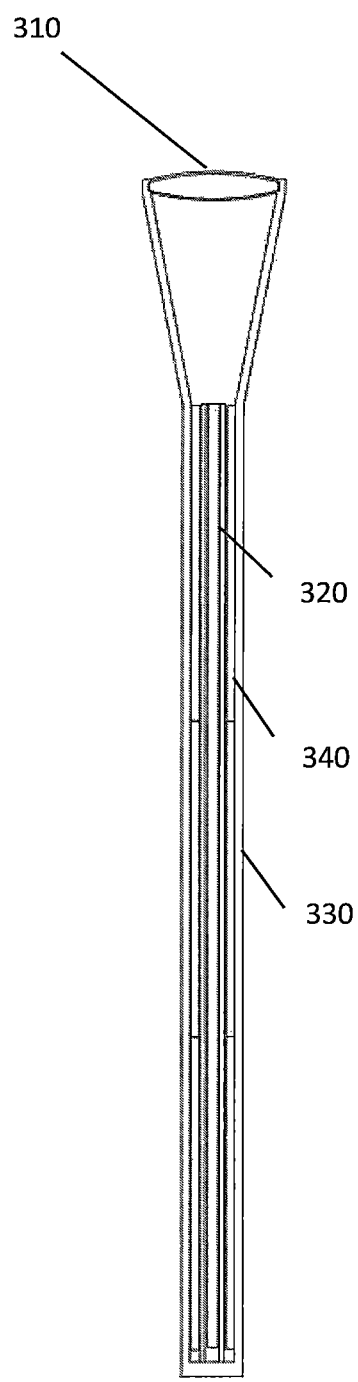
FIG. 4—A cut-away section of the second embodiment as detailed in FIG. 2.

FIG. 4 is the cut-way section of the second embodiment. The light concentrating medium is a linear concentrating lens 210 instead of a Fresnel lens, which concentrates sunlight into a thin line. The light concentrating medium is separate from the light dispersing medium in this embodiment. In this embodiment, the light dispersing medium is an edge lit light panel 220 (sometimes also called an edge lit light guide or edge lit light pane). The concentrated light is cast into a thin line, which is cast onto the edge of this light panel. The panel will take this light and disperse it out of the face of the panel. The light guide will then illuminate out the faces. One each side of the light guide three solar panels can be slid in, for a total of 6 solar panels.

What is claimed is:

1. A packaging system comprising:
   (a) a housing having:
      i) a tapered portion which includes a tapered hollow cavity and defines a front of the housing, the front of the housing includes a slot formed therein which defines an entry into the tapered hollow cavity, and wherein the tapered hollow cavity narrows to a linear hole of the housing which is opposite the slot;
      ii) a box portion which defines a hollow cavity and the hollow cavity shares the linear hole of the tapered portion such that the linear hole defines an entry into the hollow cavity;
   (b) a plurality of photovoltaic solar panels having opposing faces removably positioned within the hollow cavity of the box portion of the housing;

(c) one or more light guide panels removably disposed between the plurality of photovoltaic solar panels such as to form a stack and located within the hollow cavity of the housing,
  wherein the one or more light guide panels are one or more edge lit light panes, each having opposing planar faces connected by a peripheral edge,
  wherein a portion of the peripheral edge of each of the one or more light guide panels is adjacent to the linear hole; and
  wherein a planar face of a light guide panel of the one or more light guide panels faces toward a face of a photovoltaic solar panel of the plurality of photovoltaic solar panels; and
(d) a plurality of linear concentrating lenses linearly abutting one another and positioned within the slot of the tapered portion;
  wherein the plurality of linear concentrating lenses are formed in a row which is parallel with the peripheral edge at the linear hole of each of the one or more light guide panels and the row is perpendicular to a direction of the stack of the plurality of photovoltaic solar panels and the one or more light guide panels;
  wherein the plurality of linear concentrating lenses are configured to concentrate a light from a light source through the slot toward the linear hole of the housing to reach the one or more light guide panels;
  wherein the one or more light guide panels are configured to receive the light at the peripheral edge from the plurality of linear concentrating lenses via the linear hole;
  wherein the one or more light guide panels are configured to disperse the light via the one or more planar faces towards the faces of the plurality of photovoltaic solar panels; and
  wherein the plurality of photovoltaic solar panels and the one or more light guide panels are configured to slide in and out of the hollow cavity of the housing.

2. The packaging system of claim 1, wherein the packaging system includes a solar tracker or heliostat connected to a motor actuator system to track the light source and reposition the packaging system towards the light source.

3. The packaging system of claim 1, wherein the plurality of photovoltaic solar panels and the one or more light guide panels are stacked on one another.

4. The packaging system in of claim 1, wherein a portion of the plurality of photovoltaic solar panels are positioned horizontally next to one another along abutting edges so that the portion of the plurality of photovoltaic solar panels form a substantially planar surface.

5. The packaging system of claim 4, wherein a plurality of the packaging systems are stacked atop one another.

6. The packaging system of claim 3, wherein the plurality of linear concentrating lenses are linear convex lenses that concentrate the light into a line.

7. The packaging system of claim 6, wherein the packaging system includes three of the linear concentrating lenses.

8. The packaging system of claim 6, wherein the packaging system includes six or more photovoltaic solar panels.

9. The packaging system of claim 1, wherein the plurality of photovoltaic solar panels, the one or more light guide panels, or both are slid into the housing along an edge of the housing free of contact with the tapered portion.

10. The packaging system of claim 1, wherein the plurality of photovoltaic solar panels are free of direct contact with the light from the light source.

11. The packaging system of claim 1, wherein the tapered portion is tapered continuously from the plurality of linear concentrating lenses to the linear hole of the housing so that the tapered portion converges on the linear hole.

12. The packaging system of claim 11, wherein the plurality of photovoltaic solar panels are adapted to be slid out of the housing individually.

13. The packaging system of claim 11, wherein the plurality of linear concentrating lenses are separate and free of contact with the one or more light guide panels.

* * * * *